(12) United States Patent
Sardashti et al.

(10) Patent No.: US 10,134,585 B2
(45) Date of Patent: Nov. 20, 2018

(54) LOW TEMPERATURE ATOMIC LAYER DEPOSITION OF OXIDES ON COMPOUND SEMICONDUCTORS

(71) Applicants: The Regents of the University of California, Oakland, CA (US); GLOBALFOUNDRIES, Inc., Santa Clara, CA (US); Applied Materials, Inc., Santa Clara, CA (US)

(72) Inventors: Kasra Sardashti, San Diego, CA (US); Tobin Kaufman-Osborn, San Diego, CA (US); Tyler Kent, San Diego, CA (US); Andrew Kummel, San Diego, CA (US); Shariq Siddiqui, Albany, NY (US); Bhagawan Sahu, Albany, NY (US); Adam Brand, Sunnyvale, CA (US); Naomi Yoshida, Sunnyvale, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/830,131

(22) Filed: Aug. 19, 2015

(65) Prior Publication Data

US 2016/0056033 A1 Feb. 25, 2016

Related U.S. Application Data

(60) Provisional application No. 62/039,184, filed on Aug. 19, 2014.

(51) Int. Cl.
  *H01L 21/02* (2006.01)
  *H01L 29/66* (2006.01)
  (Continued)

(52) U.S. Cl.
  CPC ...... *H01L 21/0228* (2013.01); *H01L 21/0206* (2013.01); *H01L 21/02178* (2013.01);
  (Continued)

(58) Field of Classification Search
  CPC ......... H01L 21/02178; H01L 21/02026; H01L 21/0228; H01L 21/306; H01L 21/02301;
  (Continued)

(56) References Cited

U.S. PATENT DOCUMENTS

| 8,809,152 B2* | 8/2014 | Brodsky | ........... H01L 21/28255 257/E21.423 |
| 8,952,460 B2* | 2/2015 | Brodsky | ........... H01L 21/28255 257/369 |

(Continued)

OTHER PUBLICATIONS

Anthony, B., et al., "In situ cleaning of silicon substrate surfaces by remote plasma-excited hydrogen", J. Vac. Sci. Technol. B: Microelectronics Processing and Phenomena, vol. 7, Issue 4, (Jul./Aug. 1989), pp. 621-626.

(Continued)

*Primary Examiner* — Latanya N Crawford
(74) *Attorney, Agent, or Firm* — Greer, Burns & Crain, Ltd.; Steven P. Fallon

(57) ABSTRACT

Surface pretreatment of SiGe or Ge surfaces prior to gate oxide deposition cleans the SiGe or Ge surface to provide a hydrogen terminated surface or a sulfur passivated (or S—H) surface. Atomic layer deposition (ALD) of a high-dielectric-constant oxide at a low temperature is conducted in the range of 25-200° C. to form an oxide layer. Annealing is conducted at an elevated temperature. A method for oxide deposition on a damage sensitive III-V semiconductor surface conducts in-situ cleaning of the surface with cyclic pulsing of hydrogen and TMA (trimethyl aluminum) at a low temperature in the range of 100-200° C. Atomic layer deposition (ALD) of a high-dielectric-constant oxide forms (Continued)

an oxide layer. Annealing is conducted at an elevated temperature. The annealing can create a silicon terminated interfaces.

16 Claims, 11 Drawing Sheets

(51) Int. Cl.
*H01L 21/306* (2006.01)
*H01L 29/94* (2006.01)

(52) U.S. Cl.
CPC .. *H01L 21/02181* (2013.01); *H01L 21/02186* (2013.01); *H01L 21/02189* (2013.01); *H01L 21/02301* (2013.01); *H01L 21/02315* (2013.01); *H01L 21/306* (2013.01); *H01L 29/66181* (2013.01); *H01L 29/94* (2013.01)

(58) Field of Classification Search
CPC ......... H01L 29/66181; H01L 21/02186; H01L 21/0206; H01L 21/02315; H01L 21/02181; H01L 21/02189; H01L 29/94
See application file for complete search history.

(56) References Cited

U.S. PATENT DOCUMENTS

| | | | | |
|---|---|---|---|---|
| 9,245,742 | B2* | 1/2016 | Haukka | H01L 21/02175 |
| 2005/0106893 | A1* | 5/2005 | Wilk | C23C 16/0245 |
| | | | | 438/758 |
| 2006/0258078 | A1* | 11/2006 | Lee | C23C 16/405 |
| | | | | 438/216 |
| 2006/0292872 | A1* | 12/2006 | Haukka | C23C 16/0272 |
| | | | | 438/680 |
| 2008/0254204 | A1* | 10/2008 | Stapelmann | H01L 21/28194 |
| | | | | 427/99.2 |
| 2010/0075507 | A1* | 3/2010 | Chang | C23C 16/0272 |
| | | | | 438/763 |
| 2013/0126986 | A1* | 5/2013 | Brodsky | H01L 21/28255 |
| | | | | 257/411 |
| 2014/0109930 | A1* | 4/2014 | Kaufman-Osborn | |
| | | | | H01L 21/0206 |
| | | | | 134/1.2 |
| 2014/0113459 | A1* | 4/2014 | Kaufman-Osborn | |
| | | | | H01L 21/0206 |
| | | | | 438/796 |
| 2014/0252565 | A1* | 9/2014 | Greer | H01L 21/31122 |
| | | | | 257/635 |
| 2014/0315331 | A1* | 10/2014 | Niyogi | H01L 21/6708 |
| | | | | 438/8 |
| 2015/0140834 | A1* | 5/2015 | Kashefi | H01L 21/28194 |
| | | | | 438/771 |
| 2015/0170907 | A1* | 6/2015 | Haukka | H01L 21/02175 |
| | | | | 438/779 |
| 2015/0170914 | A1* | 6/2015 | Haukka | H01L 21/28264 |
| | | | | 438/478 |

OTHER PUBLICATIONS

Carter, Andrew, et al., "$Al_2O_3$ Growth on (100) $In_{0.53}Ga_{0.47}$ As Initiated by Cyclic Trimethylaluminum and Hydrogen Plasma Exposures", Applied Physics Express, vol. 4, No. 9, Aug. 17, 2011, pp. 091102-1-091102-3.

Cho, M.-H., et al., Interfacial characteristics of $HfO_2$ films grown on $SiO_{0.7}Ge_{0.3}$ strained by atomic-layer deposition, Applied Physics Letters, vol. 84, No. 7, Feb. 16, 2004, pp. 1171-1173.

Chobpattana, V., et al., Nitrogen-passivated dielectric/InGaAs interfaces with sub-nm equivalent oxide thickness and low interface trap densities, Applied Physics Letters, vol. 102, Issue 2, Jan. 15, 2013, pp. 022907-1-002907-3.

Currie, M.T., et al., "Carrier mobilities and process stability of strained Si n- and p-MOSFETs on SiGe virtual substrates", J. Vac. Sci. Technol. B: Microelectronics Processing and Phenomena, vol. 19, Issue 6, (Nov./Dec. 2001), pp. 2268-2279.

Gomez, Leonardo, et al., "Enhanced Hole Mobility in High Ge Content Asymmetrically Strained-SiGe p-MOSFETs", IEEE Electron Device Letters, vol. 31, No. 8, (Aug. 2010), pp. 782-784.

Han, Jaehoon, et al., "Reduction in Interface Trap Density of $Al_2O_3$/SiGe Gate Stack by Electron Cyclotron Resonance Plasma Post-nitridation", Applied Physics Express, vol. 6, No. 5, May 2, 2013, (4 pages).

Hayashi, T., et al., "Quantum Chemical Investigation of Si Chemical Dry Etching by Flowing $NF_3$ into $N_2$ Downflow Plasma", Japanese Journal of Applied Physics, vol. 51, No. 1R, Dec. 20, 2011, pp. 026505-1-026505-5.

Hua, W.-C., et al., "Ge Outdiffusion Effect on Flicker Noise in Strained-Si nMOSFETs", IEEE Electron Device Letters, vol. 25, No. 10, (Oct. 2004), pp. 693-695.

Kikuchi, Akihiko, et al., "Substrate Nitridation Effects on GaN Grown on GaAs Substrated by Molecular Beam Epitaxy Using RF-Radical Nitrogen Source", Jpn. J. Appl. Phys., vol. 33, Part 1, No. 1 B, (Jan. 1994 ), pp. 688-693.

Lu, N., et al., Ge diffusion in Ge metal oxide semiconductor with chemical vapor deposition $HfO_2$ dielectric, Applied Physics Letters, vol. 87, Issue 5, (Jul. 2005), pp. 051922-1-51922-3.

Melitz, Wilhelm, et al., "InGaAs surface preparation for atomic layer deposition by hydrogen cleaning and improvement with high temperature anneal", Journal of Applied Physics, vol. 110, Issue 1, (2011), pp. 013713-1-013713-7.

Ogawa, Dry Cleaning Technology for Removal of Silicon Native Oxide Employing Hot $NH_3/NF_3$ Exposure, Jpn. J. Appl. Phys., vol. 41, Part 1m No. 8, (Aug. 2002), pp. 5349-5358.

Oestling, Mikael, et al., "Device Integration Issues Towards 10 nm MOSFETs", Proc. 25th International Conference on Microelectronics (MIEL 2006), Belgrade Serbia and Montenegro, May 14-17, 2006, (6 pages).

Park, Young-Bae, et al., "Effect of hydrogen plasma precleaning on the removal of interfacial amorphous layer in the chemical vapor deposition of microcrystalline silicon films on silicon oxide surface", Applied Phsyics Letters, vol. 68, Issue 16, Apr. 15, 1996, pp. 2219-2221.

Von Hartmann, M., et al., "Low-frequency noise in $Si_{0.7}Ge_{0.3}$ surface channel pMOSFETs with ALD HfO2/Al2O3 gate directions", Solid-State Electronics, vol. 48, Issue 12, (Dec. 2004), pp. 2271-2275.

Wu, et al., "Structural and electrical characterization of Al2O3/ HfO2/Al2O3 on strained SiGe", Solid-State Electronics, vol. 49, Issue 2, (Feb. 2005), pp. 193-197.

Yang, et al., "Preparation and gas-sensing properties of $NiFe_2O_4$ semiconductor materials", Solid-State Electronics, vol. 49, Issue 6, (Jun. 2005), pp. 1029-1033.

* cited by examiner

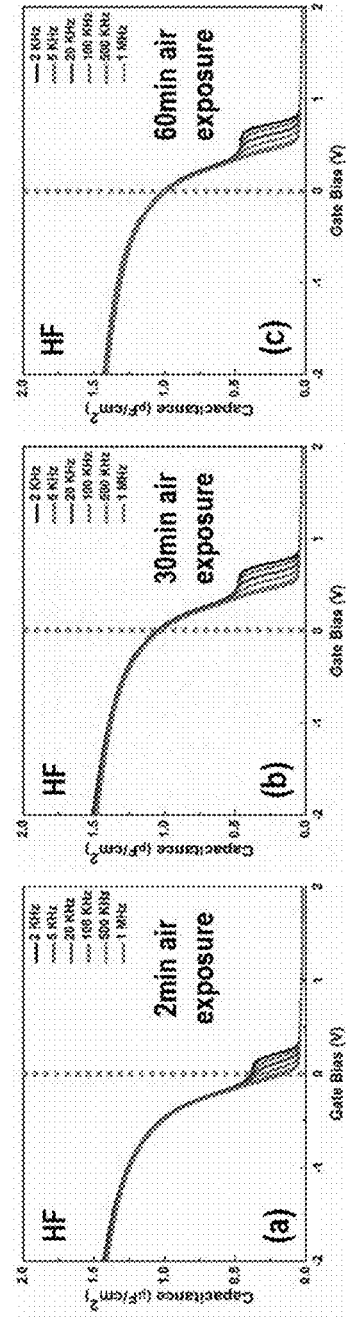
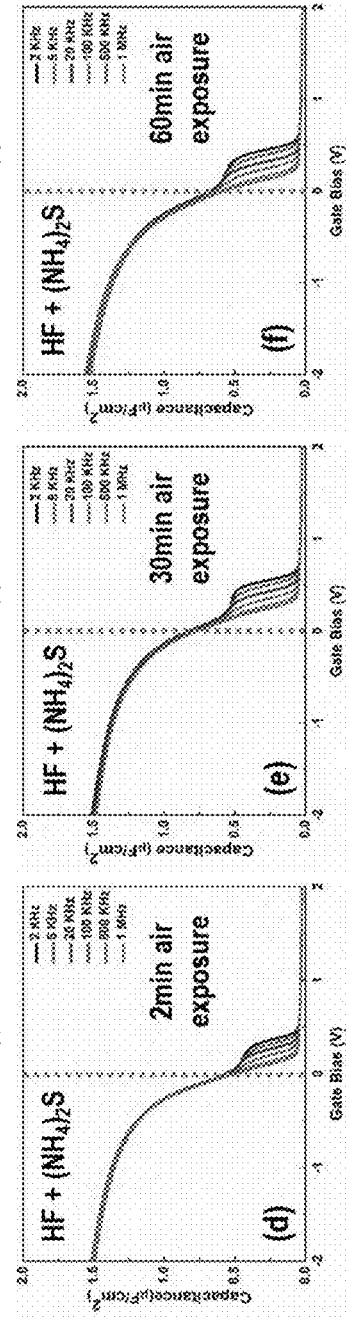
FIG. 7A FIG. 7B FIG. 7C FIG. 7D FIG. 7E FIG. 7F

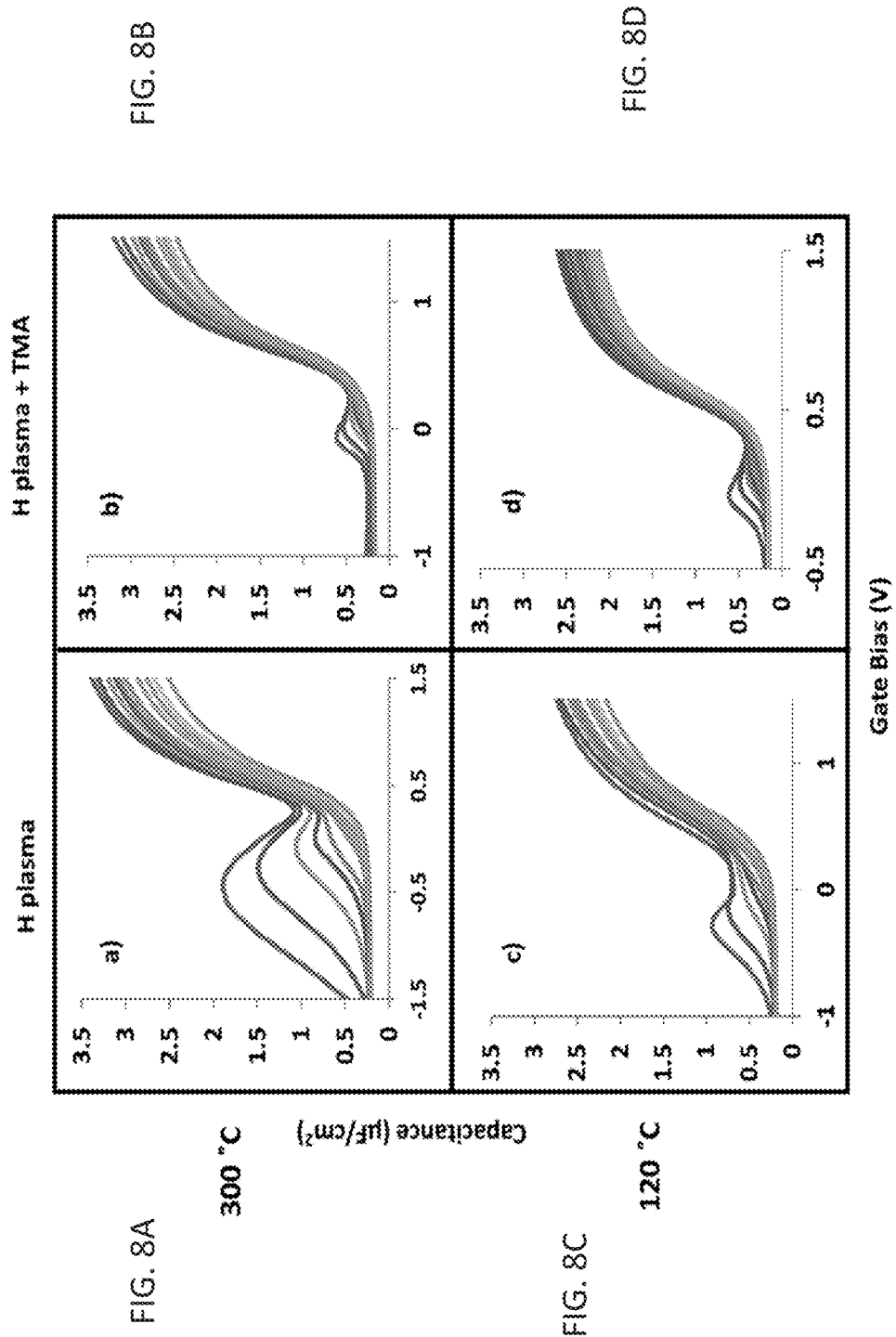

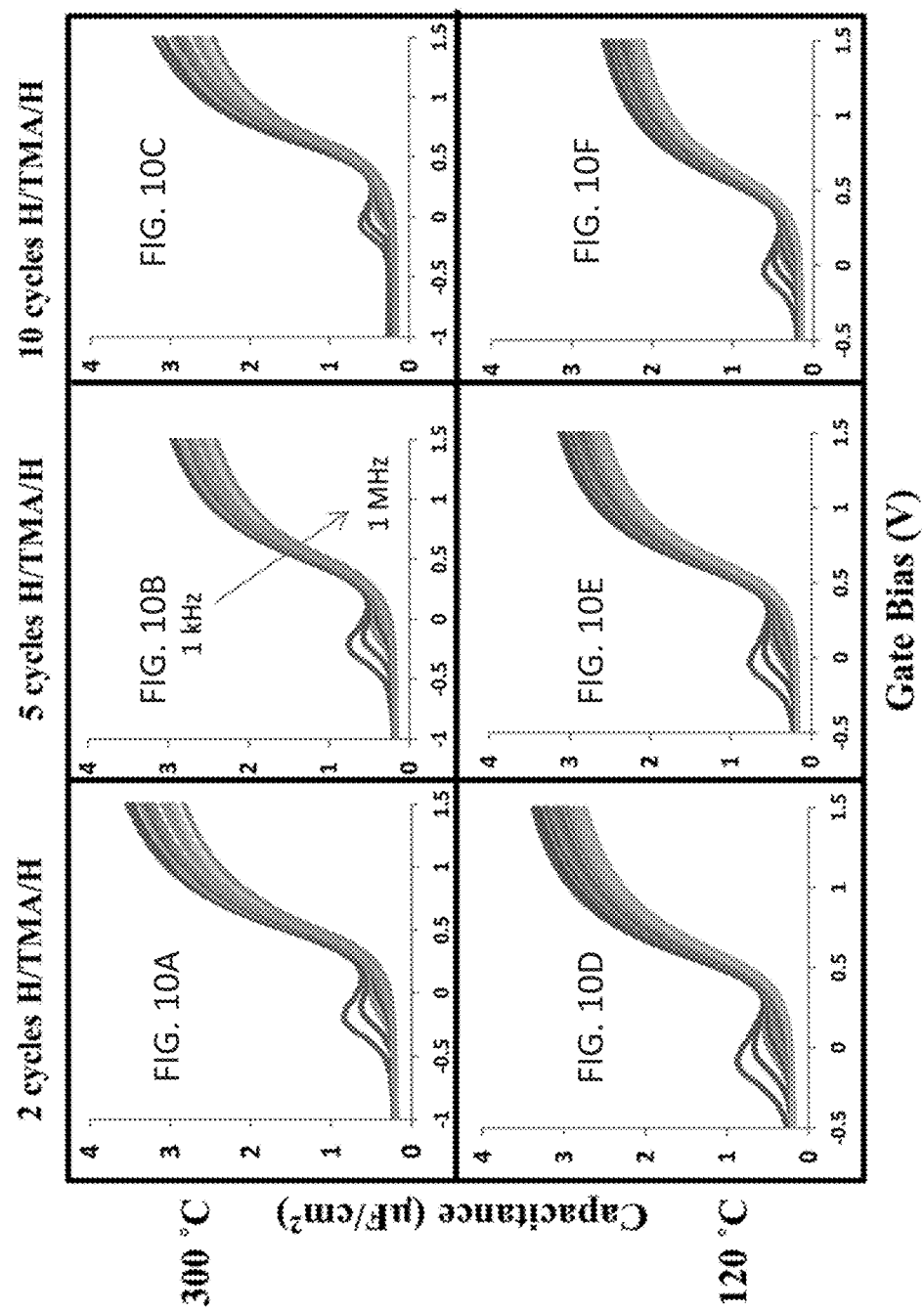

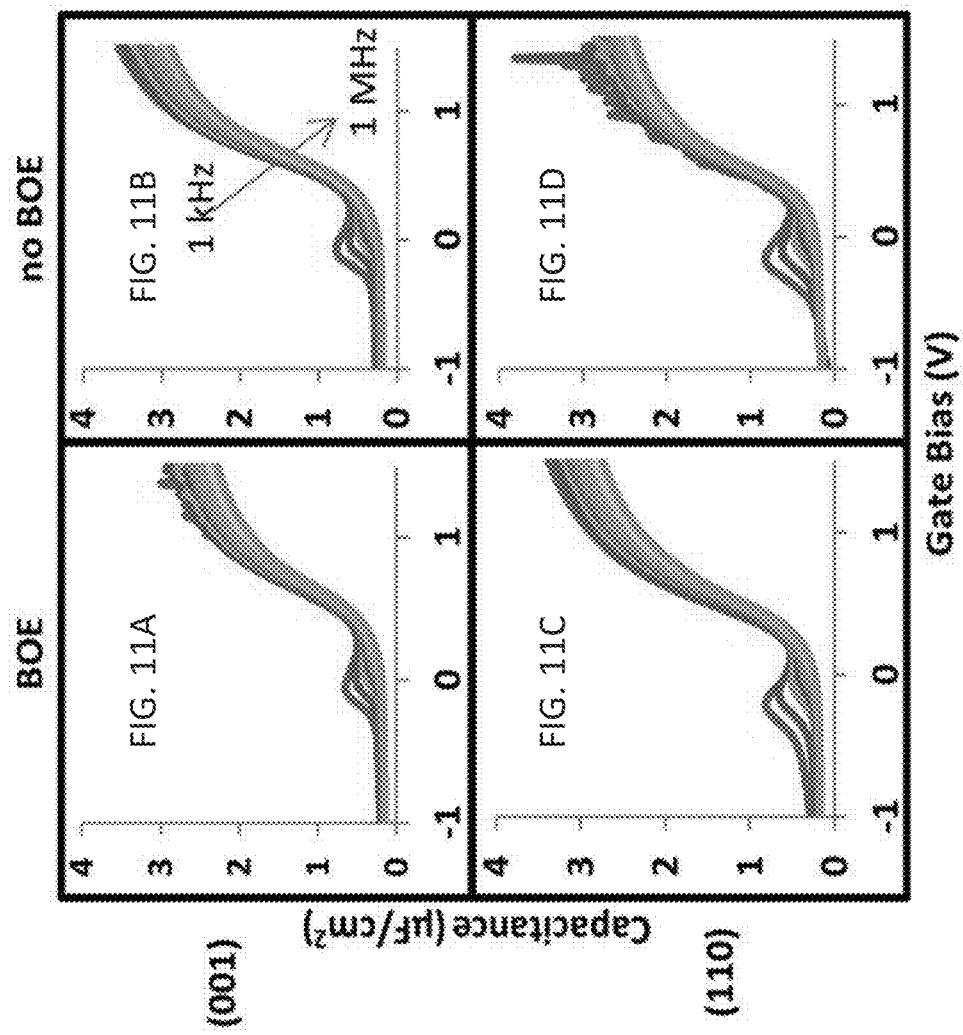

LOW TEMPERATURE ATOMIC LAYER DEPOSITION OF OXIDES ON COMPOUND SEMICONDUCTORS

PRIORITY CLAIM AND REFERENCE TO RELATED APPLICATION

The application claims priority under 35 U.S.C. § 119 and all applicable statutes and treaties from prior provisional application Ser. No. 62/039,184, which was filed Aug. 19, 2014.

FIELD

A field of the invention is semiconductor fabrication, and particularly the deposition of ultra-thin oxides. Example applications of the invention include formation of gate stacks or contact tunnel oxides. Example technologies that can benefit from the invention include MOSFET, FinFET and nanowire field effect transistors (NW-FETs) technologies.

BACKGROUND

High quality ultra-thin oxide films are critical components in the smallest transistors, such as the 14 nm technology. The ultra-thin oxide layers are deposited in the form of gate stacks and are used as gate oxides. The ultra-thin oxide layers are formed by atomic layer deposition (ALD) processes. ALD processes expose a substrate surface to a series of sequential non-overlapping precursor pulses. ALD is capable of producing ultra-thin films with control over thickness and composition at the atomic level.

The current technology for ALD gate oxide deposition on Si, Ge and SiGe substrates involves temperatures of 250° C. to 300° C. for $Al_2O_3$ and $HfO_2$ deposition. Higher temperature is considered necessary by artisans for the fast reaction of the metal precursors (i.e., TMA and TEMAH) with water and efficient removal of unreacted residual precursors from the chamber. The present inventors have identified two main disadvantages for high temperature ALD: 1) At temperatures as high as 250 or 300° C., a thin layer of $SiO_2$ or $GeSiO_x$ on SiGe (or $GeO_x$ on Ge or $GaInO_x$ on InGaAs) can form on the sample surface instantly after insertion into the chamber. Such $SiO_2$, $SiGeO_x$, $GeO_x$, or $InGaO_x$ layer can act as a nucleation barrier for the oxide or generate interface states near or at the oxide/semiconductor interface or increase the effective oxide thickness. See, e.g., M.-H. Cho, et al, "Interfacial characteristics of $HfO_2$ films grown on strained Si0.7Ge0.3 by atomic layer deposition," Appl. Phys. Lett. 84, 1171 (1984). 2) In the case of Ge and SiGe, the high temperatures create a high probability of Ge out—diffusion from the semiconductor side into the oxide. The Ge diffusion into the oxide creates higher gate leakage, as the Ge out-diffusion is expected to change the electronic structure of the substrate and degrade the gate oxide. Channel performance is decreased due to loss of Ge in the channel. Other known problems caused by such diffusion include earlier oxide break down, and higher interface trap densities at the oxide/SiGe interface. See, e.g., Lu et al., "Ge diffusion in Ge metal oxide semiconductor with chemical vapor deposition HfO2 dielectric," Appl. Phys. Lett 87, 051922.

SiGe also has application as a substrate material (or strain-relaxed buffer) for strained n-Si in order to improve electron mobility in the Si channel of a MOSFET. Currie et al., "Carrier mobilities and process stability of strained Si n- and p-MOSFETs on SiGe virtual substrates," J. Vac. Sci. Technol. B 19, (2001).

p-SiGe provides high hole mobility and therefore has potential to serve as the channel material in p-MOSFETs. See, Gomez at al. "Enhanced Hole Mobility in High Ge Content Asymmetrically Strained-SiGe p-MOSFETs," IEEE Elec. Dev. Lett, 31 (8) (2010) p 782. SiGe provide much higher hole mobility than silicon and SiGe provides better electron mobility than Si, making the material suitable for both p-MOSFET and n-MOSFET. SiGe MOSFET scaling requires a low-leakage, high-k oxide with a relatively defect-free interface with SiGe.

There are very few reports on deposition of gate oxides on SiGe and oxide/SiGe interface characterization. Von Hartmaan et al. reported the deposition of a tri-layer of $Al_2O_3/HfO_2/Al_2O_3$ on a $Si_{0.7}Ge_{0.3}$ p-MOSFET channel via ALD at 300° C. The overall oxide quality and $HfO_2$ trap density was characterized by measuring the Id-Vd and p-MOSFET's low frequency drain noise. See, Von Haartman et al., Low-frequency noise in Si0.7Ge0.3 surface channel pMOSFETs with ALD HfO2/Al2O3 gate dielectrics," Solid-State Elec., 48(12), (2004) p 2271. The possibility of device integration in SiGe devices for this tri-layer was separately reported. Ostling et al. concluded that this tri-layer has better drain noise compared to pure $Al_2O_3$ and $HfO_2$. See, Ostling et al., Low-frequency noise in $Si_{0.7}Ge_{0.3}$ surface channel pMOSFETs with ALD HfO2/Al2O3 gate dielectrics," Proc. 25th International Conference On Microelectronics (2006). However, the oxide and oxide/interface were not independently characterized by measuring C-V curves. In both reports, HR-TEM images showed presence of a thin SiOx layer at the $Al_2O_3$/SiGe interface.

Wu et al reported deposition of a 4 nm thick mixed layer of $Al_2O_3/HfO_2/Al_2O_3$ on strained p-SiGe by dosing TMA, HfCl4 and water at 300° C., and observed a 0.7 nm thick layer of mixed $Al_2O_3$—$SiO_x$ when an HF clean was followed by a water rinse. Wu et al., "Structural and electrical characterization of $Al_2O_3/HfO_2/Al_2O_3$ on strained SiGe," Solid-State Elec., 49, (2005) p 193. In the Wu et al. and Von Haartman et al reports, the Al2O3 is employed as a spacer between $HfO_2$ and SiGe to prevent interfacial reactions (i.e., Ge out-diffusion) during the routine post deposition annealing of the devices. Despite low gate leakage as a function of gate bias, the device C-V curves showed high fixed and interface trap charges as well as false inversion.

To control and reduce the density of interface trap states, Han et al applied electron cyclotron resonance (ECR) plasma post-nitridation after Al2O3 deposition at 250° C. by ALD on $SiGe_{0.25}$. Han et al., "Reduction in Interface Trap Density of $Al_2O_3$/SiGe Gate Stack by Electron Cyclotron Resonance Plasma Post-nitridation," Appl. Phys. Express 6, 051302 (2013). Ostling et al compared $HfO_2$, $Al_2O_3$ and $HfAlO_x$ deposited on strained p-SiGe at 300° C. by ALD and concluded that $HfAlO_x$ has the best properties in terms of MOSFET drain noise and hole mobility. Oestling et al., Low-frequency noise in Si0.7Ge0.3 surface channel pMOSFETs with ALD $HfO_2/Al_2O_3$ gate dielectrics," Proc. 25th International Conference On Microelectronics (2006). Si—Ge and Ge materials are used in 3D architectures, including the finFET, which utilize the SiGe(001) and (110) crystal faces simultaneously, thus requiring passivation methods for the (110) face in order to ensure a pristine 3D surface prior to further processing.

For III-V finFETs, again (001) and (110) crystal faces will also be employed and need to be passivated. An additional challenge for III-V semiconductor based FETs is the large density of trap states at the semiconductor/oxide interface. High-k materials such as HfO2 and Al2O3 provide better performance, but continued aggressive down scaling of the gate oxide requires maximizing the nucleation density of the high-k atomic layer deposition (ALD) precursors, so that the dielectric closes to form a continuous film on the substrate in a small number of ALD reaction cycles.

Compound semiconductor based MOS devices also suffer from a relatively high density of interface trap states (Dit) at the semiconductor/high-k interface. These electronic trap states result from physical defects at the interface such as dangling bonds, metallic bonds, strained bonds, and defective native oxides. These can result directly from poor initiation of high-k ALD on the semiconductor surface. To increase drive current and minimize power consumption of III-V devices, it is important to minimize the Dit. Subcutaneous oxidation of the substrate and plasma induced damage during pre-ALD in-situ surface cleans can also generate Dit. One of the present inventors and colleagues have previously demonstrated hydrogen to remove native oxide. W. Melitz, J. Shen, T. Kent, A. C. Kummel, and R. Droopad, "InGaAs surface preparation for atomic layer deposition by hydrogen cleaning and improvement with high temperature anneal," J. App. Phys. 110, 013713 (2011). Others have shown that at high temperature (e.g. 300° C.) use of TMA and H2 plasma after a wet cleaning and prior to ALD of $Al_2O_3$ and $HfO_2$ can improve capacitance voltage (C-V) characteristics with deposition at 300° C. Andrew D. Carter, William J. Mitchell, Brian J. Thibeault, Jeremy J. M. Law, and Mark J. W. Rodwell, "$Al_2O_3$ Growth on (100) $In_{0.53}Ga_{0.47}As$ Initiated by Cyclic Trimethylaluminum and Hydrogen Plasma Exposures," Applied physics express 4, 091102 (2011); V Chobpattana, J Son, J J M Law, R Engel-Herbert, C Y Huang, S Stemmer, "Nitrogen-passivated dielectric/InGaAs interfaces with sub-nm equivalent oxide thickness and low interface trap densities," Applied Physics Letters 102 (2), 022907 (2013).

SUMMARY OF THE INVENTION

A preferred method for forming an oxide on a SiGe or Ge surface cleans the SiGe or Ge surface to provide a hydrogen terminated surface or a sulfur passivated surface (sulfur passivated including S—H passivation). Atomic layer deposition (ALD) of a high-dielectric-constant oxide at a low temperature is conducted in the range of 25-200° C. to form an oxide layer, preferably from 100-200° C., more preferably less than 150° C. and most preferably ~115-120° C. Annealing is conducted at an elevated temperature. A method for oxide deposition on a damage sensitive semiconductor surface conducts in-situ cleaning of the surface with cyclic pulsing of hydrogen and TMA (trimethyl aluminum) at a low temperature in the range of 100-200° C. Atomic layer deposition (ALD) of a high-dielectric-constant oxide forms an oxide layer. Annealing is conducted at an elevated temperature. The annealing can create a silicon terminated surface.

BRIEF DESCRIPTION OF THE DRAWINGS

FIGS. 7A-7F show multi-frequency C-V measurements for $Al_2O_3$ on SiGe with 2 min, 30 min and 60 min of air exposure between wet cleaning and $Al_2O_3$ ALD for (a,b,c) HF treated and (d,e,f) S-passivated surfaces prior to ALD. The green dotted line indicates the zero gate bias.

FIGS. 8A and 8B respectively show capacitance vs. gate bias for $HfO_2$/InGaAs(001) MOSCAPs with pre-deposition in-situ cleaning via H plasma only (left) and H/TMA/H (right) for 300° C. and FIGS. 8C and 8D compare 120° C. deposition temperatures;

FIGS. 10A-10F are C-V curves for 2, 5 and 10 cycles of H/TMA/H cleaning at 300° C. (FIGS. 10A-10C) and 120° C. (FIGS. 10D-10F);

FIGS. 11A-11D are C-V curves for InGaAs (001) (FIGS. 11A-11B) and InGaAS (110) (FIGS. 11C-11D) with and without preliminary ex-situ BOE cleaning before in-situ H/TMA/H cleaning.

DESCRIPTION OF THE PREFERRED EMBODIMENTS

Figure 1:
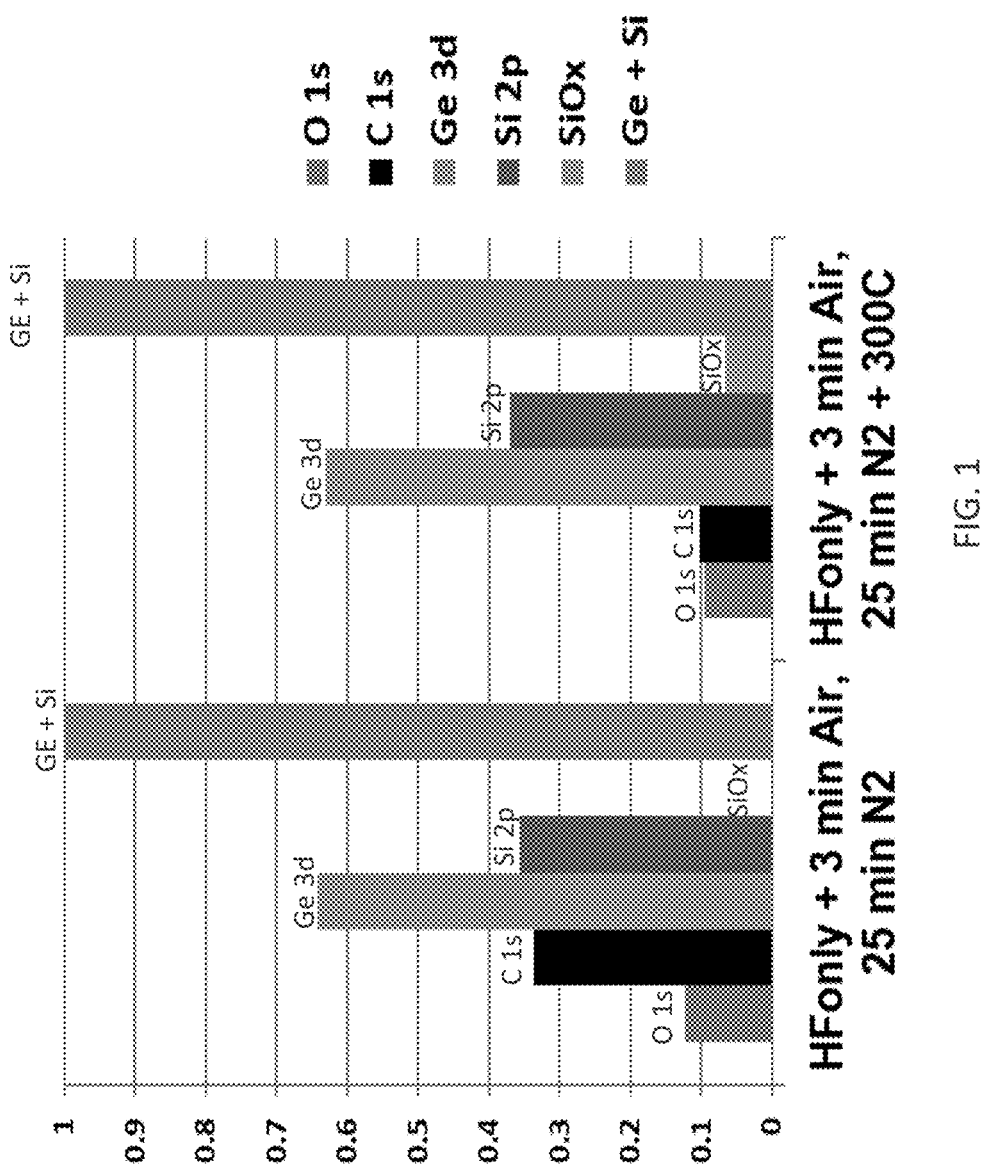
FIG. 1 is experimental X-ray photoelectron spectroscopy (XPS) data of a SiGe(100) after HF solution clean and exposure to air for 3 min and clean N2 (from liquid N2 vaporization) for up to 25 min at 300° C.

A preferred method of the invention is a method for oxide deposition on SiGe and Ge surfaces. Other preferred methods of the invention provide for low temperature oxide deposition on InGaAs and related materials. Preferred methods for oxide deposition on SiGe and Ge include a wet clean or gaseous fluorine containing clean to remove surface oxide followed by in-situ atomic H to prevent etching, and low temperature oxide ALD to prevent Ge diffusion into the oxide and $GeO_x$, $SiO_x$, and $GeSiO_x$ formation at the interface. Preferred methods for deposition on InGaAs and related materials use an in-situ H/TMA/H at low temperature to remove oxide and carbides followed by low temperature or high temperature ALD; the low temperature clean reduces the plasma damage from H on InGaAs and related materials. The SiGe or Ge surface is cleaned to provide a hydrogen terminated surface (cleaning may include a $(NH_4)2S$ clean which leaves hydrogen, sulfur, and —SH passivation. Atomic layer deposition is then conducted with a high-dielectric-constant oxide at a temperature of less than 200°. An anneal is conducted at an elevated temperature, preferably above 230° C.

Preferred methods of the invention minimize interface states formation during a low temperature (25° C. to 200° C., preferably less than 150° C. and most preferably ~115-120° C.) ALD oxide formation on SiGe and Ge surfaces that is followed by a short forming gas anneal (above 230° C. and most preferably 250° C.). Embodiments of the invention low temperature ALD deposition of oxide layers or oxide bilayers to prevent Ge outgassing, e.g. to prevent $HfO_2$—SiGe reaction, and control the flat band voltage by oxide interface dipoles.

Low temperature ALD on SiGe and Ge surfaces of $Al_2O_3$ and $HfO_2$ and other oxide layers and bilayers in accordance with the invention can be applied in the semiconductor industry to deposit very thin oxides on for gate stacks or contact tunnel oxides. Preferred methods of the present invention provide a very simple ex-situ surface cleaning with low temperature ALD. The method of the invention minimizes the SiOx formation and Ge out-diffusion in the oxide. The lack of crystallographic dependence is critical, for example, in the complex geometries in FinFET scaled contacts.

Low temperature ALD oxide deposition on SiGe and Ge surfaces in preferred embodiments of the invention provides a number of advantages: (1) Formation of SiOx which increases the total oxide thickness and GeOx which both increases the total oxide thickness and degrades the interface quality and reliability is prevented in the ALD chamber before and during the oxide deposition at low temperature. (2) Low temperature oxide deposition prevents the oxide quality degradation by Ge out-diffusion into the oxide. (3) Low temperature deposition allows ALD with a CVD component which eliminates dependence of ALD growth rate on substrate's crystallographic orientation. (4) After low temperature oxide deposition, a post deposition anneal allows formation of a Si—O—Al interface which is nearly ideal for reliability and forming gas annealing reduction of trap states. (5) At low temperature of the invention, the in-situ atomic hydrogen cleaning clean causes minimal surface damage even with a remote plasma atomic H source.

For InGaAs and related materials (InAs, GaAs), additional methods of the invention provide in-situ H cleaning methods with TMA dosing and ALD deposition of an oxide on damage sensitive III-V surfaces. Damage sensitive surfaces include SiGe, Ge, InAs, and InGaAs. The TMA pulses are shown to minimize plasma damage at 200° C. and 120° C. on damage sensitive surfaces. At low temperatures, at or less then 200° C. and most preferably at or below 150° C., at least 10 cycles of H/TMA/H dosing are preferable, and 20 cycles or more are especially preferred.

Embodiments of the invention provide methods to clean Ge and SiGe surfaces, e.g., SiGe(100) surfaces, with 50, 60 and 70% Ge and deposit high-dielectric-constant oxides such as $Al_2O_3$, $HfO_2$ and $HfO_2/Al_2O_3$ bilayer with high bulk and interface quality using low temperature atomic layer deposition (ALD) with (a) high nucleation density and (b) minimal Ge out-diffusion or GeOx formation, and (c) formation of a Si—O-oxide terminated surface upon post deposition annealing.

Example experimental data and results from SiGe (100) support that the combination of the cleaning and the low temperature ALD of the invention is applicable to other surfaces. Additional embodiments of the invention provide methods to clean SiGe(110) with Ge contents from 30% to 70% Ge and with other high-dielectric-constant oxides such as $ZrO_2$ and $TiO_2$ and oxide bilayers such as $ZrO_2/Al_2O_3$ and $TiO_2/Al_2O_3$. The example experimental data also support a pure Ge surface, because surface studies indicate that an interfacial $GeO_x$ layer will be avoided, which is desirable because it is thermodynamically unstable and thus would cause reliability problems. This supports the low temperature methods of the invention being applicable to pure Ge as well as SiGe.

The surface cleaning in preferred methods for SiGe and Ge surfaces includes removal of Si and Ge native oxides from the surface using ex-situ cyclic $HF/H_2O$ aqueous solutions and/or sulfur solutions, and in-situ cleaning with $NH_3$ plasma and H/TMA/H. The ex-situ and/or in-situ cleaning step is conducted to leave the SiGe or Ge surface hydrogen-terminated or S-passivated (including S—H passivation). Hydrogen-termination protects the surface during short air exposures (<10 min) while the sample is being transferred to the ALD chamber after ex-situ cleaning or kept in clean $N_2$ purge in the reactor after ex-situ or in-situ cleaning The sulfur termination was tested to extend the protection up to 60 minutes of exposure in air.

For SiGe and Ge surfaces: A preferred in-situ cleaning uses $NH_4F$ condensation and heating along with atomic H for carbon removal and surface passivation. Even with ex-situ HF cleaning, longer air exposure can be tolerated if followed by in-situ H cleaning to remove carbon and hydrocarbons. Oxide deposition can be performed, for example, at 120° C. in both medium vacuum (millitorr or torr) continuous flow and high vacuum ALD chambers for both $Al_2O_3$ and $HfO_2$.

For SiGe and Ge surfaces: The present inventors are unaware of any prior reports of ALD at low temperature (e.g. 200 and preferably <150° C.) on any SiGe surface, as provided by certain preferred embodiments. Although one set of example experimental ALD MOSCAP data is on p-type SiGe(001) and SiGe(110), surface science STM/STS studies show the technique would also work on n-type SiGe. $Al_2O_3$ deposition is preferably performed by cyclic pulsing of Trimethylaluminum (TMA) and water ($H_2O$) in a continuous flow medium vacuum ALD reactor with argon as the carrier gas but other inert gasses would suffice.

For SiGe and Ge surfaces: Experiments demonstrate ALD deposition of $Al_2O_3$ on clean SiGe can be performed at low temperature, and most preferably ~115-120° C. At low temperature, the H-terminated SiGe surface is resistant to $SiO_x/GeO_x$ formation during the initiation of the ALD reactions and throughout the bulk oxide ALD reactions. In addition, the activation energy for Ge out-diffusion is high enough that a very small amount of Ge would be found in the oxide. Methods of the invention provide high oxide/semiconductor interface with a conventional surface cleaning, and do not require more sophisticated surface cleanings. Cleaning with cyclic HF, single-step HF dip and different concentrations of HF for single-step dip showed similar results. In-situ cleaning using $NH_4F$ and atomic H is expected to be equally efficient.

For InGaAs and related materials (InAs, GaAs), the preferred embodiment for low temperature $HfO_2$ ALD deposition on damage sensitive III-V substrate is performed by cyclic pulsing of Tetrakis-ethylmethylamino hafnium (TEMAH) and $H_2O$ in a high vacuum ALD chamber, e.g. with base pressure $5 \times 10^{-6}$ torr after an in-situ clean. The in-situ clean is preferred to improve nucleation using multiple cycles of H/TMA (trimethyl aluminum)/H. The TMA reduces the etching of the surface by atomic H and assists the oxide ALD nucleation. The H/TMA/H clean was tested in experiments for HfO2 ALD on InGaAs (001) and InGaAs (110), after in-situ cleaning and nucleation at low and high temperatures (120° C. and 300° C.).

For InGaAs and related materials (InAs, GaAs), preferred methods of the invention provide high quality ultra-thin $HfO_2$ on damage-sensitive III-V substrates with low leakage and low defect concentration at the oxide/semiconductor interface. The addition of the in-situ H/TMA/H cleaning allows control of any etch damage while providing improved nucleation. This method can be extended to Ge and SiGe surfaces.

Preferred embodiments of the invention will now be discussed with respect to experiments. Broader aspects of the invention will be appreciated from the experimental data, which is described in detail for the sake of completeness and not to limit broader aspects of the invention.

SiGe(100) with HF Clean-Test MOS Capacitors

A SiGe(100) sample was dipped in HF solution for 1 minute. Exposure to air for 3 min and clean $N_2$ (from liquid $N_2$ vaporization) for up to 25 min at 300° C. did not result in a considerable increase in the amount of surface C and O after cleaning. Surface composition and amount of surface contamination were measured by X-ray photoelectron spectroscopy (XPS) and shown in FIG. 1. It is expected that similar results would be obtained with $NH_3/NF_3$ plasma (or other methods of generating $NH_4F(g)$ or $SF_6/H_2$ plasma) to remove $SiO_x$ and $GeO_x$ and atomic H to remove carbon and passivate the surface. It is also noted that the processes described above and below are expected to work equally well on SiGe(110) crystal planes and with different SiGe compositions since the thermodynamics of surface cleaning will not vary substantially with these properties.

Figures 2A, 2B, 2C:
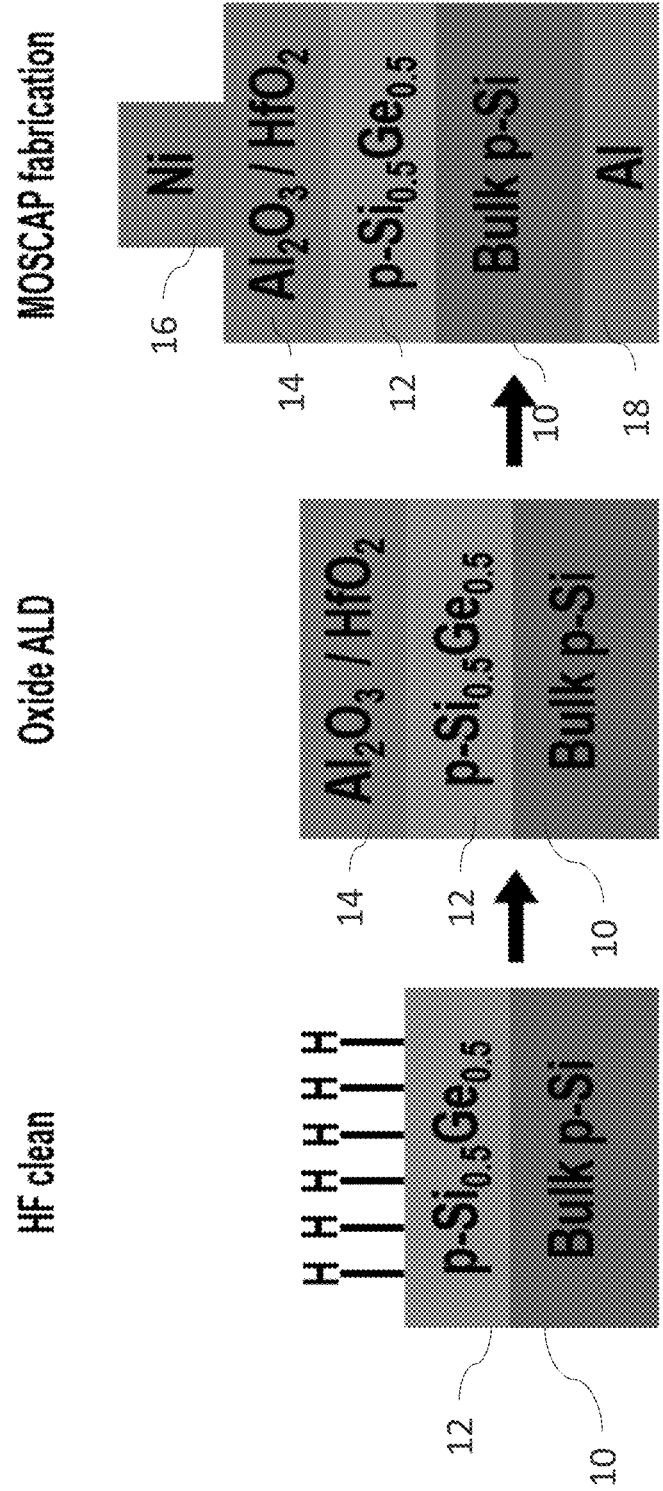
FIGS. 2A-2C illustrate an experimental process flow according to a preferred embodiment for the fabrication of test Metal-Oxide-Semiconductor capacitors (MOSCAPs)

FIGS. 2A-2C illustrate an experimental process flow according to a preferred embodiment for the fabrication of test Metal-Oxide-Semiconductor capacitors (MOSCAPs). In FIG. 2A, bulk silicon 10 includes an SiGe layer 12, having a surface that is cleaned by HF solution to be H-terminated. The Si substrate 10 with SiGe 12 having the cleaned surface is transferred to the ALD chamber with less than 5 min of exposure to air. In FIG. 2B, ALD oxide deposition is conducted at 115 to 120° C. in a continuous flow reactor with constant 150 sccm flow of Ar as the carrier gas to deposit an ultra-thin layer 14 of $Al_2O_3$.

To accomplish the $Al_2O_3$ deposition, prior to TMA/$H_2O$ pulses, 20 pre-pulses of TMA for 45 ms were introduced into the chamber. Afterwards, 30 cycles of TMA and H2O doses were applied sequentially on the sample surface. The pulse times for TMA and H2O were 200 ms and 50 ms, respectively, with 6 s Ar purge after each pulse.

In FIG. 2C, after the ALD oxide deposition, a 50 nm thick Ni gate metal layer 16 was deposited by thermal evaporation. Backsides were etched locally by HF, Ar sputtered at 100 W for 1 min. Afterwards, a 100 nm layer 18 of Al was deposited on the backside by DC sputter deposition at 200 W. Once the MOS capacitor was fabricated, oxide and oxide/SiGe interface was characterized by measuring the Cg-Vg and Ig-Vg curves.

Figure 3:
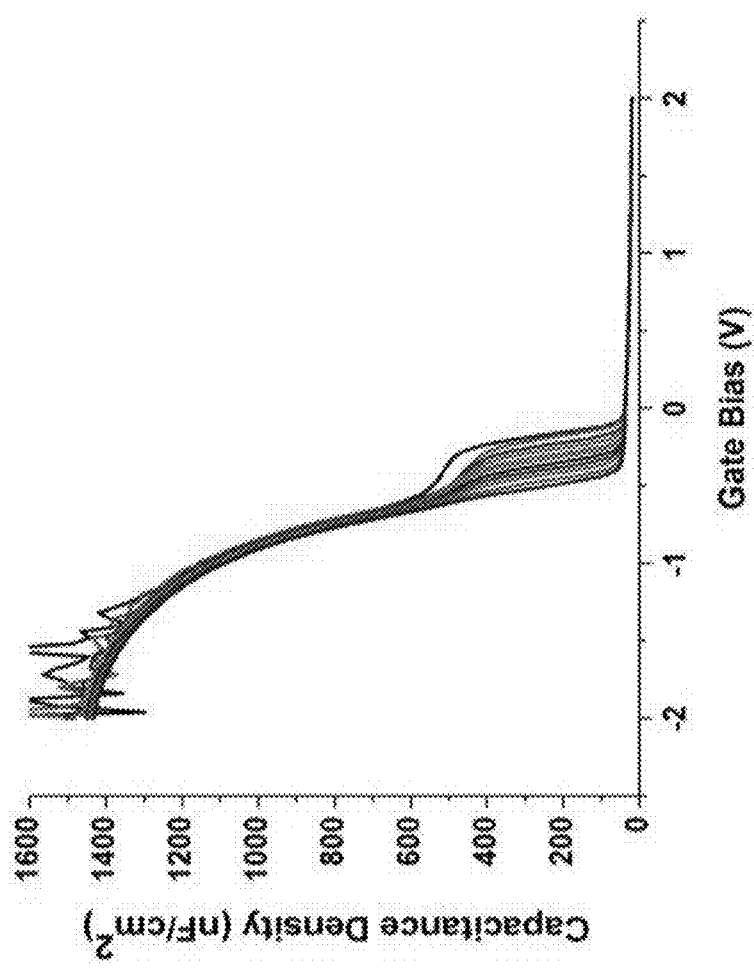
FIG. 3 are C-V curves for experimental $Si_{0.3}Ge_{0.7}$(100) with an $Al_2O_3$/SiGe oxide/semiconductor interface formed in accordance with a preferred method (prior to a forming gas anneal), with the C-V curves being measured at frequencies from 1 KHz to 1 MHz.

FIG. 3 shows the C-V curves (capacitance vs. gate bias) for an experimental $Si_{0.3}Ge_{0.7}(100)$ MOSCAP formed generally in accordance with FIGS. 2A-2C with an $Al_2O_3/SiGe$ grown at 120° C. by ALD, at frequencies from 2 KHz to 1 MHz. The steep turn-on and small bump near the flat band voltage is associated with a low interface state density (Dit).

Figure 4:
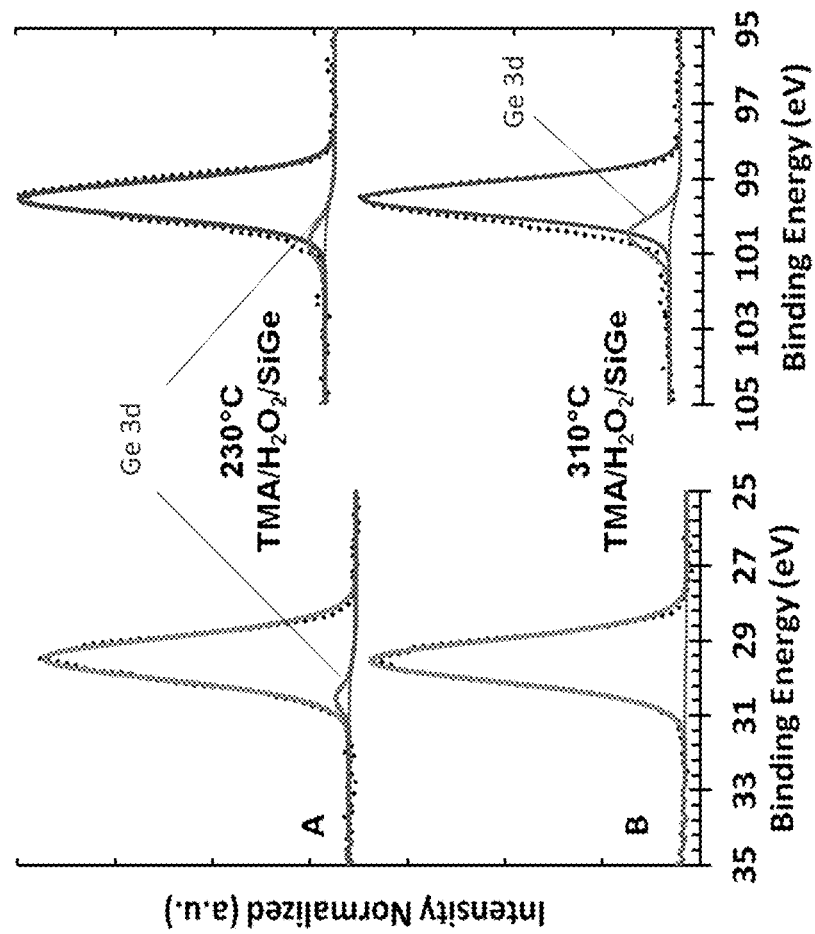
FIG. 4 shows Si and Ge XPS peaks after annealing $Al_2O_3$ at 230° C. and 310° C. on SiGe(110)

FIG. 4 shows the composition at the SiGe/oxide interface on SiGe(100) as a function of annealing. If oxide deposition is conducted at 120° C., the interface is expected to be composed of mostly Ge—O—Al bonds. Upon annealing to 230° C. or 310° C., a place exchange occurs at the interface resulting in Si—O—Al bonding (see increase of higher binding energy peak on Si2p and reduction of higher binding energy feature on Ge 3d upon annealing—labelled curve in FIG. 4). This result is beneficial because it demonstrates the ability for oxide deposition without $SiO_2$ formation. Additionally, any unreacted Si at the interface can be passivated by FGA minimizing Dit, since after annealing the top SiGe layer is terminated by Si—O—Al bonds.

Previous results in the Kummel research group at the University of California at San Diego had shown a Si-terminated surface could be formed by pre-dosing with $H_2O_2(g)$ and a post deposition anneal forms Si—OH on the surface. See, T. Kaufman-Osborn, E. Chagarov, S. Park, B. Sahu, S. Siddiqui, and A. C Kummel "Atomic imaging and modeling of passivation, functionalization, and atomic layer deposition nucleation on the SiGe(001) surface via $H_2O_2(g)$ and trimethylaluminum dosing." Surf Sci, 630, pp. 273-279 (2014). The present experiments show that after deposition of even a monolayer of $Al_2O_3$, Ge—Si place exchange will also occur to form a layer of Si—O—Al bonds after annealing above 250 C, so pre-dosing with $H_2O_2(g)$ and annealing prior to oxide ALD is not required. The same effect is expected with $H_2O$ as an oxidant with other oxides deposited on SiGe such as $HfO_2$, $ZrO_2$, and $TiO_2$ since the process is driven by the strength of Si—O vs Ge—O bonds and is independent of the nature of the oxide as long as the bonds are sufficiently strong in the oxide to prevent silicide formation at the annealing temperature.

Density Functional Theory (DFT) models were simulated to better understand the bonding between the oxide and the SiGe(100) surface. The simulations simulated amorphous aluminum oxide bonded to either a silicon or germanium terminated SiGe(100) surface. The amorphous aluminum oxide was bonded to the SiGe surface, annealed, and then allowed to relax to the lowest energy configuration. The models showed mixed bonding (both Al and O bonding to both Ge and Si) occurs at the interface with no formation of an interlayer of Si or Ge oxide.

Figure 5:
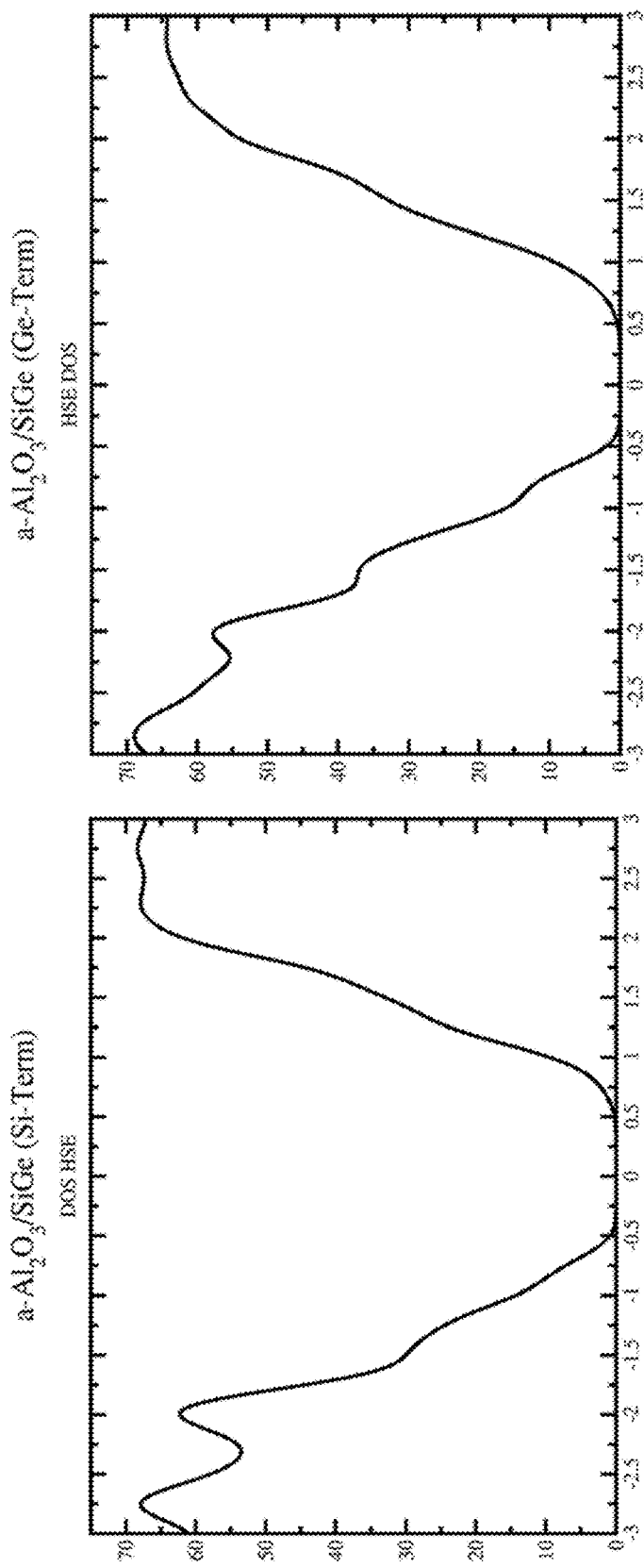
FIGS. 5A and 5B are Density Functional Theory (DFT) density of states (DOS) simulations of aluminum oxide bonded to SiGe with (FIG. 5A) silicon termination and (FIG. 5B) germanium termination.

To better understand the effect of the amorphous oxide bonding to the SiGe(100) surface, DFT simulations modeled the surface density of states (DOS). FIGS. 5A and 5B respectively show the density of states of silicon terminated and germanium terminated surfaces, when bonded to the aluminum oxide, have an unpinned interface with no states in the bandgap, demonstrating the ability for aluminum oxide to bond to the SiGe(100) surface of either termination without a large density of interface traps. The Si-terminated interface of FIG. 5A (formed via post-deposition anneal) shows a slightly wider band gap and thus a method such as post deposition anneal to form a Si—O—Al interface is preferred.

Figure 6:
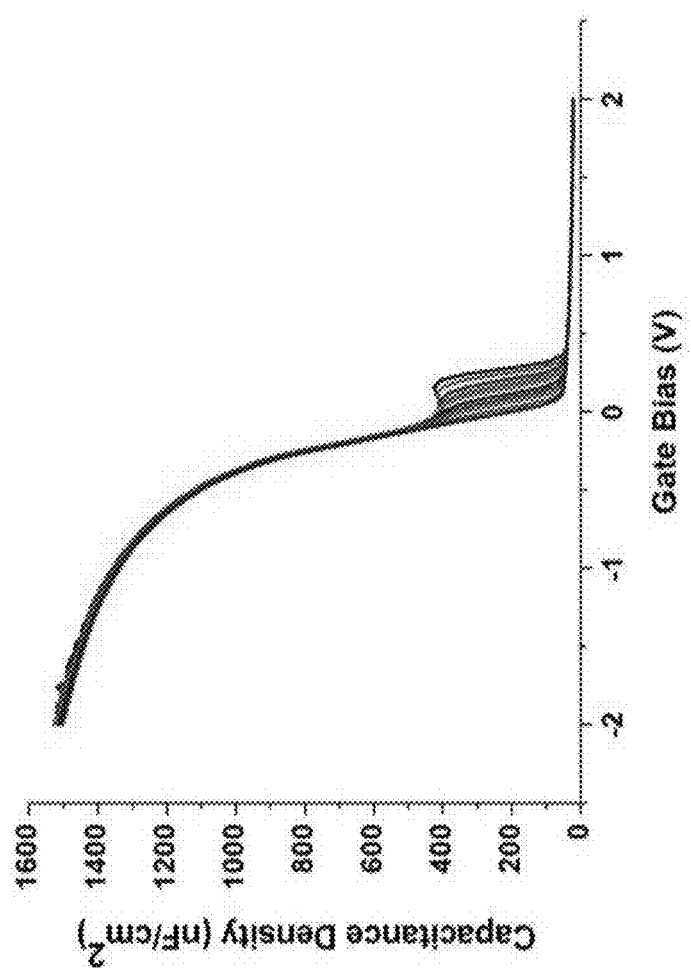
FIG. 6 shows C-V curves for the Si0.7Ge0.3(100) MOSCAP samples formed in accordance with FIGS. 2A-2C after a forming gas anneal.

After the C-V curves were measured, to improve the dispersion near the flat band voltage and in accumulation, samples fabricated in accordance with FIGS. 2A-2C were annealed in forming gas (5% $H_2$/95% $N_2$) for 15 min. This treatment is known to result in atomic hydrogen formation by $H_2$ reacting with catalytic Ni surface. Also, Al/SiGe contacts became more ohmic and the contact resistance dropped after FGA. C-V curves for the SiGe MOSCAPs after the FGA (forming gas anneal) are shown in FIG. 6. The FGA removed nearly all the dispersion in accumulation which is associated with both series resistance (contact and bulk semiconductor) and border traps (i.e. tunnel like traps). The FGA also removed all the dispersion near flat band which is associated with interface traps (Dit).

Ex-Situ Sulfur Clean of SiGe(001) Interfaces

Additional experiments tested S-passivation with ex-situ $(NH_4F)2S$ clean on $Al_2O_3/SiGe(001)$ interface composition and electrical characteristics. $Al_2O_3$ was deposited on SiGe at 120, 200 and 300° C. via atomic layer deposition. Electrical properties of the $Al_2O_3/Si_{0.7}Ge_{0.3}$ (100) interfaces were characterized by capacitance-voltage (C-V) and current-voltage (I-V) measurements on MOS capacitors. Chemical compositions of the oxide/SiGe interfaces for different ALD temperature in the presence or absence of the $(NH_4)2S$ clean were determined by angle resolved x-ray photoelectron spectroscopy (AR-XPS). The experiments showed that S-passivation (which include S—H passivation) strongly prevented the formation of Ge—O interface bonding and assisted the formation of direct Si—O—Al bonding between $Al_2O_3$ and SiGe.

A 12 nm thick p-type $Si_{0.7}Ge_{0.3}$ (100) with doping level of $2\times10^{18}$ cm$^{-3}$ (Applied Materials) was grown epitaxial on p-type Si(100) by molecular beam epitaxy (MBE). $Al_2O_3$—SiGe metal-oxide-semiconductor capacitors (MOSCAPs) were fabricated by ALD deposition of $Al_2O_3$ followed by 50 nm Ni gate deposition via thermal evaporation and 100 nm Al back contact deposition using DC sputtering. Prior to ALD, the native oxide was removed by cyclic HF clean using 2% HF solution and DI water at 25° C. for 1 min in each solution for 2.5 cycles, ending with HF dip. For ex-situ sulfur passivation, samples were dipped for 30 min in 25% (NH4)2S solution at 25° C. To deposit thin $Al_2O_3$ by ALD, samples were transferred into the ALD chamber with minimal exposure to air (maximum 2 min) ALD was performed at 120, 200 and 300° C. in a Beneq TFS-200 continuous flow reactor, with Ar as the carrier gas. Al2O3 deposition started with 20 cycles of 45 ms Trimethylaluminum (TMA) pulses followed by 30 consecutive cycles of 200 ms of TMA and 50 ms of $H_2O$. After each of TMA and $H_2O$ pulses a 6-s Ar purge was employed. The chamber pressure during the ALD process was 1.7 torr. The deposition rate determined by elliposometry on a Si(100) monitor sample was 1.03 A/cycle. Therefore, the oxide thickness is estimated as 3.1 nm. After fabrication, MOSCAPs were annealed in forming gas (5% $H_2$, 95% $N_2$) at 250° C. for 15 min.

Capacitance-Voltage (C-V) spectroscopy of the MOSCAPs was performed using an Agilent B-1500 semiconductor analyzer, with AC modulation amplitude of 30 mV, in the gate bias range of −2 to 2V, at multiple frequencies from 2 KHz to 1 MHz. Using the capacitance and conductance vs. gate voltage, the densities of interface traps were calculated using the full interface state model with D circuit of three complex elements method, and the density of border traps (Nbt) was extracted by Taur's model assuming a spatially uniform trap distribution. Gate leakage vs. gate bias was measured in the same bias range. To determine the composition of $Al_2O_3/Si_{0.7}Ge_{0.3}(001)$ interfaces as a function of surface preparation method, angle resolved x-ray photoelectron spectroscopy (AR-XPS) as well as near-normal angle XPS were performed on SiGe samples after 8 cycles of $Al_2O_3$ ALD. AR-XPS measurements were performed by a VG Theta Probe system using an Al-Kα excitation source (1486.7 eV). Si2p, Ge2p, Ge3d, Al2p, S2p and O1s spectra were obtained at various take-off angles starting from 26.75° To 79.25° with 7.5° steps. Near-normal angle XPS was performed using a monochromatic XM 1000 MkII/SPHERA (by Omicron Nanotechnology) XPS system with an Al-Kα source (E=1486.7 eV). For all measurements, a take-off angle of 30° from the sample surface was used.

The S-clean/passivation showed some advantages compared to HF cleaning. The S-passivated samples showed stability of the flat band voltage (FIG. 7). For HF-cleaned samples, after 30 min or 60 min exposure to air, VFB shifted by 450 mV. Conversely, S-passivated interfaces were maintained nearly constant VFB (<120 mV variation). Leakage current for HF-cleaned surfaces in accumulation increased more than an order of magnitude by exposing samples to air for 30 or 60 min. Conversely, the leakage currents for S-passivated samples at all gate biases had nearly zero change as a function of surface air exposure prior to ALD. Chemical bonding was also investigated. Samples produced via both HF cleaning and S-cleaning were analyzed to have Si—O bonds at the interface. However, S-passivation resulted in significant increase in the SiOx/GeOx ratio at the interface (from 1.3 for HF-treated to 2.23 for S-passivated surfaces) leaving the $Al_2O_3$—SiGe interface almost exclusively terminated with Si—O—Al rather than Ge—O—Al bonds. Al2p peaks on HF-treated and S-passivated surfaces were measured after 0.8 nm of $Al_2O_3$ deposition at 120, 200 and 300° C. These peaks were measured by AR-XPS at the take-off angle of 64.25°. S-passivation resulted in at least twice larger Al2p intensity consistent with better nucleation density of $Al_2O_3$ on the SiGe(001) surfaces.

The experiments showed that in the absence of S-passivation, lower ALD temperature results in higher $Al_2O_3$—SiGe interface quality and lower gate oxide leakage for H-terminated SiGe. By applying ex-situ S-passivation using (NH$_4$)2S, much weaker dependence of interface quality and leakage current on the ALD temperature was observed. In addition, S-passivation resulted in greater air stability of the cleaned surface against ambient oxidation. Specifically, for up to an hour of air exposure, VFB maintained in the same range as the sample with no air exposure, showing the capability of this passivation in extending the device fabrication queue time. XPS measurements revealed that S passivation removes a large amount of Ge—O bonds at the $Al_2O_3$—SiGe interface, leading to the direct bonding in between them via Al—O—Si. Moreover, S-passivation led to higher nucleation density consistent with an order of magnitude smaller leakage current compared to H-terminated samples.

In-Situ Low Temperature H/TMA/H Clean of III-V Surfaces

An addition to the ex-situ clean is an in-situ H/TMA/A clean. This cleaning procedure was tested on InAs and InGaAs surfaces, which are comparable to SiGe for sensitivity to plasma damage. FIGS. 8A and 8B respectively show capacitance vs. gate bias for HfO$_2$/InGaAs(001) MOSCAPs with pre-deposition cleaning via H plasma only (left) and H/TMA/H (right) for 300° C. and FIGS. 8C and 8D compare 120° C. deposition temperatures.

Hydrogen plasma is known as an effective way to remove native oxides and hydrocarbons from semiconductor surfaces. Park et al., "Effect of hydrogen plasma precleaning on the removal of interfacial amorphous layer in the chemical vapor deposition of microcrystalline silicon films on silicon oxide surface," Appl. Phys. Lett. 68, 2219 (1996). However, H plasma is a chemical etching process that can cause damage to the surface and increase density of interfacial defects even at temperatures as low as 120° C. B. Anthony et al., "In situ Cleaning of Silicon Substrate Surfaces by Remote Plasma-Excited Hydrogen," J. Vac. Sci. Technol. B7, 621-626 (July/August 1989).

We have determined that such H plasma damage can be minimized by adding TMA pulses in between the H-plasma steps (hereinafter H/TMA/H clean) at low temperatures of preferably 200° C. or less. The H/TMA/H in-situ cleaning method has been successfully employed for HfO2 deposition on InAs and InGaAs. As shown by comparing FIG. 8A to 8B and FIG. 8C to 8D, addition of a TMA pulse after the H plasma exposure results in a significant reduction of plasma damage at both 300° C. and 120° C. on InGaAs surfaces. This additional TMA pulse is expected to have the same benefits on SiGe at low temperatures, thereby reducing the dispersion at flatband voltage. This has also been confirmed on other damage sensitive compound semiconductors (InGaAs(001) and InGaAs(110)) The H cleaning data on InGaAs in FIGS. 8A and 8C show that if only H is used, low temperature is required to prevent substrate damage. A large false inversion bump is observed in FIGS. 8A and 8C, which is attributed to the plasma damaging the InGaAs surface, but the addition of a TMA pulse dramatically reduces the magnitude of the false inversion bump suggesting it is preventing or repairing plasma damage as shown in FIGS. 8B and 8D.

The InGaAs (110) samples related to the data in FIGS. 8A-8D were grown by MBE with $1\times10^{-17}$ Si doping on a n-type InP (110) substrate. Samples were initially degreased with a 3 min submersion in acetone, isopropyl alcohol, and deionized (DI) water. The native oxide was removed with a 3 min buffered oxide etch followed by a 1 min rinse in DI water. The samples were quickly (1-2 min) transferred to an Oxford Instruments FlexAL Vacuum ALD reactor. In example cleaning cycles, 10 cycles of 20 mTorr inductively coupled 100 W $H_2$ plasma for 2 sec, 40 ms of 200 mTorr TMA, and another $H_2$ pulse were employed for a pre-ALD surface clean. For the 120° C. samples, $HfO_2$ was deposited using a 1 sec pulse of tetrakis(ethylmethylamino)hafnium (TEMAH), a 7 sec Ar purge, a 1 sec H2O pulse, and a 35 sec purge. For 300° C. $HfO_2$ deposition 80 mTorr of TEMAH was dosed for 1 sec followed by a 80 mTorr Ar purge for 5 sec, a 5 sec pump cycle, a 80 mTorr dose of $H_2O$ for 60 msec, a 80 mTorr Ar purge for 7 sec, and a 7 sec pump cycle. All samples underwent a 15-min forming gas anneal at 400° C. The gate metal was 50 nm of thermally evaporated Ni. The backside contact was 20 nm of thermally evaporated Ni followed by 80 nm of thermally evaporated Au. CV curves were measured using a HP4284ALCR meter and an Agilent B1500 Semiconductor Device Analyzer.

The growth rate for the $HfO_2$ was slightly more than 1 angstrom/cycle; this is consistent with a small CVD component. We have shown this small CVD component is critical to remove the crystallographic dependence of growth on InGaAs (001) and InGaAs (110)(FIGS. 9A and 9B).

Figures 9A, 9B:
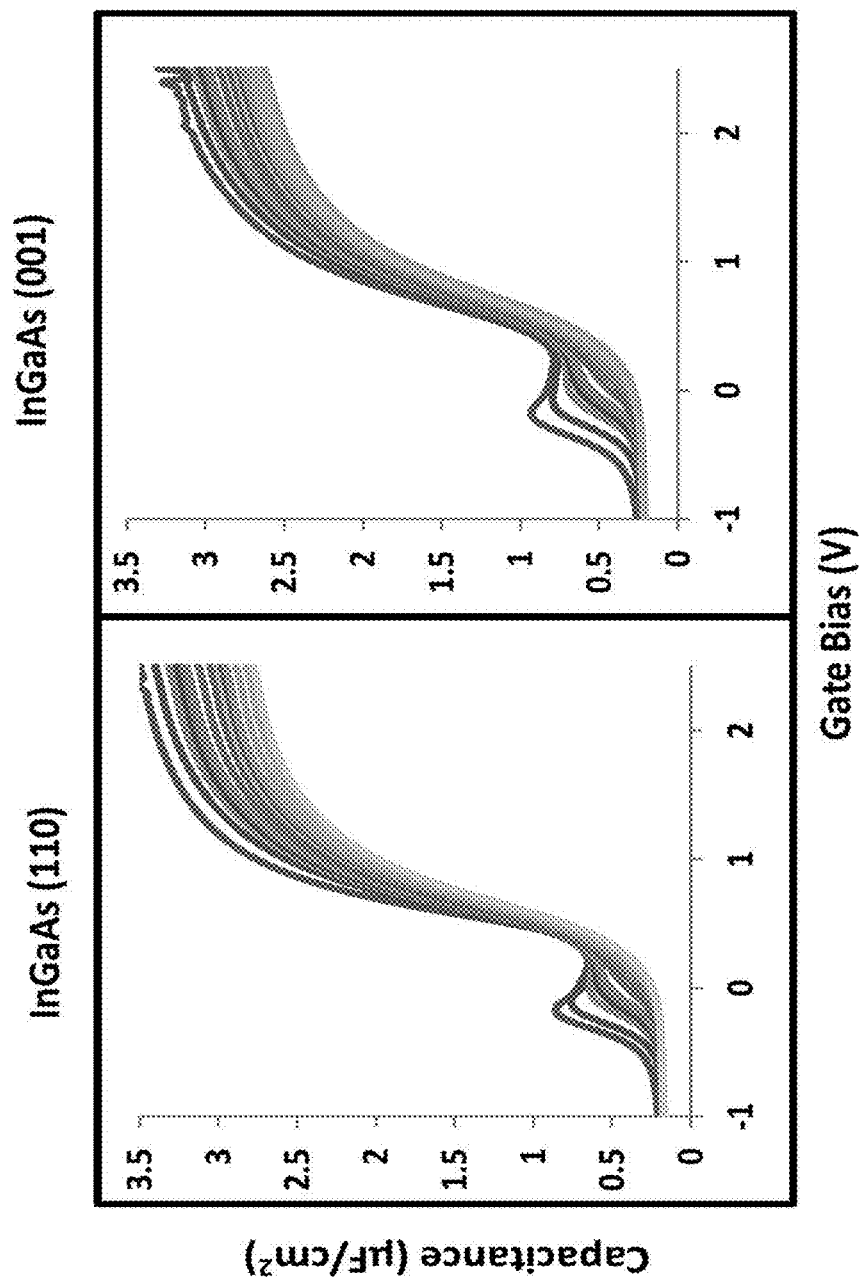
FIGS. 9A and 9B show C-V curves for $HfO_2$/InGaAs (110) and HfO2/InGaAs(110) MOSCAPs samples formed at 120° C. in accordance with FIGS. 2A-2C at after in-situ H/TMA/H cleaning.

FIGS. 9A and 9B show C-V curves for samples produced with $HfO_2$ deposited simultaneously on InGaAs(110) and InGaAs(001) at 120° C. HfO2 MOSCAPs were also fabricated by a similar procedure shown in FIGS. 2A-2C for $HfO_2$/InGaAs MOSCAPs.

The number of pre-ALD in-situ H/TMA/H cleaning cycles was investigated, and FIGS. 10A-10F show the resultant C-V curves at 300° C. (FIGS. 10A-10C) and 120° C. (FIGS. 10D-10F) for between 2 and 10 cycles. At 300° C., exposing the sample to 5 or more cycles of the pre clean results in a Cmax of ~2.4 µF/cm2. This reduction in Cmax compared to the 2 cycle case is attributed to an increase in nucleation density of $HfO_2$ which results from more efficient removal of native oxide or surface contaminants with 5 or more cycles. At 120° C., the Cmax continually decreases as the number of cleaning cycles increases. This suggests the H plasma is not as effective at removing native oxide at lower temperatures, hence more cleaning cycles are required to maximize the nucleation density of $HfO_2$. It is important to note that despite a 5× increase in plasma exposure at both temperatures, the false inversion bumps actually decreases, indicating efficient surface cleaning by the H plasma and also the importance of TMA in protecting the surface from plasma damage or repairing the damage.

The frequency dispersion of capacitance in accumulation and depletion show no significant change among the samples, but Dit hump in the inversion region does decrease with increasing number of cycles, as for the 300° C. ALD condition. Despite a 5× increase in plasma exposure, there was no evidence of plasma damage, highlighting the importance of TMA in this process. At lower temperatures, at least 10 H/TMA/H cycles are preferred based upon the test data to maximize the effectiveness of the plasma treatment and enhance the nucleation of $HfO_2$ during subsequent ALD. When 20 cycles are employed there is noticeable plasma damage (not shown).

The effect of the BOE (buffered oxide etch) ex-situ cleaning on both InGaAs (001) and (110) surfaces and its impact on $HfO_2$ nucleation at 120° C. and 300° C. was studied and the C-V curves are shown in FIGS. 11A-11D. The wet cleaned samples were loaded into the ALD reactor with a maximum 2 min air exposure. All four samples were in the ALD reactor simultaneously to ensure identical deposition conditions, and each received 10 cycles of H/TMA/H pre-ALD surface clean and 30 cycles of $HfO_2$ ALD. The (001) sample which received the BOE shows a maximum capacitance at high frequency of ~2 µF/cm² whereas the sample which did not receive the BOE shows a Cmax of ~2.6 µF/cm². A reasonable explanation is that the native oxide on the non-BOE sample limits the nucleation of $HfO_2$ on the (001) surface. Limited nucleation would result in a thinner overall oxide and, therefore, a higher Cmax. Additionally, the non-BOE sample shows a slightly larger Dit hump in the inversion region. This can be attributed to the presence of a variety of InGaAs native oxides which are known to be a source of trap states in III-V based devices. The (110) surface shows no significant difference between the wet cleaned and non-wet cleaned samples. This indicates $HfO_2$ is nucleating identically on both samples, and suggests that the BOE is not effective on this surface or that the (110) surface has such a thin native oxide that the BOE etch is immaterial when in situ atomic H is employed.

Table 1 below summarizes peak Dit and Nbt densities for various samples. Samples which received H/TMA/H treatment have Nbt densities between 1.9 and 2.2×1020 cm-3 eV-1. The sample which received exposure to H plasma only at 300° C. exhibits a much higher density of border traps. This indicates TMA reduces the number of trap states at the InGaAs/$HfO_2$ interface and minimizes defects in the oxide formed during H cleaning. All samples which had TMA incorporated into the pre-ALD clean have Dit values between 2.0 and 3.8×10$^{12}$ cm$^{-2}$ eV-1 whereas the samples exposed to H alone at 120° C. has 3.8×10$^{12}$ cm$^{-2}$ eV-1 and the sample exposed to H alone at 300° C. has 14×10$^{12}$ cm$^{-2}$ eV-1. Thus, TMA plays an important role in minimizing both interface defects and border traps regardless of crystal face, temperature, or ex situ wet cleans. It is noted that the low temperature samples consistently had a lower Dit than the 300° C. samples; a statistical analysis was performed which showed this difference had a p value of <0.05.

|  | $V_{fb}$ (V) | $C_{ox}$ (uF/cm²) | $N_{bt}$ (×10$^{20}$ cm$^{-3}$eV$^{-1}$) @ E − $E_c$ = 0.5 V | $D_{it}$ (×10$^{12}$ cm$^{-2}$eV$^{-1}$) @ E − $E_c$ = 0.5 V |
|---|---|---|---|---|
| (001) 10 cycles H only 120° C./300° C. | 0.63/0.53 | 4.3/5.3 | 2.2/3.0 | 3.8/14 |
| (001) 2 cycles H/TMA 120° C./300° C. | 0.57/0.50 | 4.8/6.5 | 1.8/2.0 | 3.8/3.5 |
| (001) 5 cycles H/TMA 120° C./300° C. | 0.55/0.50 | 4.5/4.9 | 1.7/1.9 | 2.7/3.3 |
| (001) 10 cycles H/TMA 120° C./300° C. | 0.60/0.62 | 3.7/5.5 | 1.9/2.2 | 2.0/2.0 |
| (001) BOE 120° C./300° C. | 0.57/0.63 | 3.8/4.8 | 2.3/2.1 | 2.9/3.4 |
| (001) no BOE 120° C./300° C. | 0.56/0.60 | 5.2/6.8 | 2.4/2.0 | 2.8/3.4 |
| (110) BOE 120° C./300° C. | 0.59/0.50 | 4.5/6.0 | 2.2/1.9 | 2.8/3.2 |
| (110) no BOE 120° C./300° C. | 0.59/0.55 | 4.6/5.5 | 2.1/2.0 | 2.8/3.5 |

All samples which had TMA incorporated into the pre-ALD clean, regardless of the process temperature or ex situ BOE cleaning, exhibit very similar Dit values of 2-3.8×10$^{12}$ cm$^{-2}$ eV-1 at E–Ec=–0.5, Table 1. From the interface defect analysis it can be concluded that BOE clean is not necessary to achieve high quality interfaces between HfO2 and InGaAs (and related materials). The samples do show a greater variation in the Dit toward the VB. However, in an n-channel flat band architecture III-V MOSFET, the Fermi level is only modulated in the upper half of the band gap making interface states below the mid gap less significant for limiting device performance. The border trap densities (Nbt) were also extracted and shown Table 1. All samples which had TMA incorporated into the pre-ALD surface clean had Nbt values between 1.7 and 2.4×10$^{20}$ cm$^{-3}$ eV-1. The sample which was exposed to H only at 300° C. had an Nbt of 3.0×10$^{20}$ cm$^{-3}$ eV-1. The majority of samples processed at 120° C. had a lower Dit than the samples processed at 300° C. and statistical analysis showed, using an alpha value of 0.05, a p value of <0.05 indicating lowering the ALD temperature resulted in reduction of Dit. An α value of 0.05 indicates the results have 95% chance of being a direct result of manipulation of experimental variables while obtaining a p value less than the a value, (<0.05), suggests that these results are due to the temperature differences. This indicates TMA-based surface pre-treatment not only reduces the density of defects at the InGaAs/HfO$_2$ interface but also results in a more robust oxide, as border traps are associated with defects within the oxide and are thought to be located within about 1 nm from the semiconductor/oxide interface. The oxide capacitances (Cox) at 120° C. and 300° C. vary due to anomalies in the ALD growth rate which can qualitatively influence the apparent magnitude of Dit bump but the quantitative Dit will not be influenced since Cox is factored in when extracting the Dit. While it is possible that under some processing conditions thinner oxide may have higher Dit due to defect generation in metallization, it has been reported that Dit can be nearly invariant with oxides thickness.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention.

Various features of the invention are set forth in the appended claims.

The invention claimed is:

1. A method for oxide deposition on a damage sensitive semiconductor surface, the method comprising:
   in-situ cleaning of the surface with cyclic pulsing of hydrogen and TMA (trimethyl aluminum) at a low temperature in the range of 100-200° C.;
   conducting atomic layer deposition (ALD) of a high-dielectric-constant oxide to form an oxide layer; and
   annealing at an elevated temperature.

2. The method of claim 1, further comprising an ex-situ buffered oxide etch cleaning.

3. The method of claim 1, wherein the low temperature is 200° C. or less and the in-situ cleaning is limited to 5 cycles or less.

4. The method of claim 1, wherein the low temperature is 120° C. and the in-situ cleaning comprises a least 10 cycles.

5. The method of claim 1, wherein the damage sensitive surface comprises one of InGaAs, InAs, GaAs, SiGe and Ge.

6. The method of claim 1, wherein the high-dielectric-constant oxide comprises Al$_2$O$_3$.

7. The method of claim 6, wherein said conducting comprises cyclic pulsing of Trimethylaluminum (TMA) and H$_2$O.

8. The method of claim 1, wherein the high-dielectric-constant oxide comprises HfO$_2$.

9. The method of claim 8, wherein said conducting comprises cyclic pulsing of Tetrakis-ethylmethylamino hafnium (TEMAH) and H$_2$O.

10. The method of claim 1, wherein the high-dielectric-constant oxide is one of ZrO$_2$, TiO$_2$, a ZrO$_2$/Al$_2$O$_3$ bilayer and a TiO$_2$/Al$_2$O$_3$ bilayer.

11. The method of claim 1, wherein the low temperature is less than 150° C.

12. The method of claim 11, wherein the low temperature is in the range of ~115-120° C.

13. The method of claim 1, wherein said annealing is conducted with a forming gas at an anneal temperature above 230° C.

14. The method of claim 13, wherein the anneal temperature is between 200° C. and 300° C.

15. The method of claim 1, wherein the SiGe or Ge surface comprises p-type SiGe.

16. The method of claim 1, wherein the SiGe or Ge surface comprises n-type SiGe.

* * * * *